United States Patent [19]
Kepler

[11] Patent Number: 6,156,615
[45] Date of Patent: Dec. 5, 2000

[54] METHOD FOR DECREASING THE CONTACT RESISTANCE OF SILICIDE CONTACTS BY RETROGRADE IMPLANTATION OF SOURCE/DRAIN REGIONS

[75] Inventor: Nick Kepler, Saratoga, Calif.

[73] Assignee: Advanced Micro Devices, Inc., Sunnyvale, Calif.

[21] Appl. No.: 09/163,313

[22] Filed: Sep. 30, 1998

[51] Int. Cl.$^7$ .................................................. H01C 21/336
[52] U.S. Cl. ......................... 438/305; 438/529; 438/592
[58] Field of Search .................................. 438/655, 305, 438/597, 529, 592; 257/382, 383, 384

[56] References Cited

U.S. PATENT DOCUMENTS

| 5,156,994 | 10/1992 | Moslehi | 438/647 |
| 5,387,535 | 2/1995 | Wilmsmeyer | 438/621 |
| 5,482,895 | 1/1996 | Hayashi et al. | 438/620 |
| 6,001,737 | 12/1999 | Horiuchi et al. | 438/683 |
| 6,008,111 | 12/1999 | Fushida et al. | 438/584 |
| 6,015,752 | 1/2000 | Xiang et al. | 438/655 |
| 6,072,222 | 6/2000 | Nistler | 257/383 |

FOREIGN PATENT DOCUMENTS

0651076 A1  5/1995  European Pat. Off. .

OTHER PUBLICATIONS

Wolf Silicon Processing for the VLSI Era: vol. II—Process Integration, 1990, month unknown, p. 389.
Wolf, Silicon Processing for the VLSI Era, vol. 3: The Submicron MOSFET, pp. 595–598, 1995, month unknown.

*Primary Examiner*—Richard Booth

[57] ABSTRACT

A semiconductor device and method of forming contacts for the semiconductor device performs a retrograde implant of dopant in the source/drain regions so that the concentration of the dopant within these regions is highest at a predetermined depth below the top surface of the substrate. This depth is made to coincide with the bottom surfaces of the silicide contacts at the source/drain regions. Since the bottom of the silicide contacts are located at the region of greatest doping concentration within the source/drain junctions, the contact resistance is maintained relatively low while the sheet resistance may be made lower by increasing the thickness of the silicide contacts.

6 Claims, 4 Drawing Sheets

METHOD FOR DECREASING THE CONTACT RESISTANCE OF SILICIDE CONTACTS BY RETROGRADE IMPLANTATION OF SOURCE/DRAIN REGIONS

FIELD OF THE INVENTION

The present invention relates to the field of semiconductor device manufacturing, and more particularly to methods of forming silicide contacts on the source/drain regions of a semiconductor device.

BACKGROUND OF THE INVENTION

In the manufacture of integrated circuits, a commonly used practice is to form silicide on source/drain regions and on polysilicon gates. This practice has become increasingly important for very high-density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$ and $NiSi$. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both gate etch and source/drain junction formation. After deposition, the metal blankets the polysilicon gate electrode, the oxide spacers, the oxide isolation, and the exposed electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. Metal silicide regions 20, comprising cobalt silicide, for example, have been formed on the source/drain junctions 12, 14, the polysilicon gate 16.

To form the metal suicide regions 20, a refractory metal layer is deposited over the device. A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 1 in which the higher resistivity metal silicide has been transformed to the lowest resistivity phase metal silicide. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used for salicide processing in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European Publication No. 0651076. Cobalt silicide ($CoSi_2$) has been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as nickel, platinum, or palladium are that cobalt silicide provides low resistivity, allows lower-temperature processing, and has a reduced tendency for forming diode-like interfaces.

Another important advantage of cobalt silicide over titanium silicide is the improvement that cobalt silicide provides in transistor drain saturation current (Idsat). This is a measure of how fast a transistor is able to turn on. The drain saturation current is improved because the cobalt silicide is normally thinner than conventional titanium silicide on the source/drain areas so that the cobalt silicide will contact the source/drain areas at a region of higher dopant concentration. FIG. 2 is a plot of a source/drain junction doping concentration as it varies with the source/drain junction depth in a conventionally doped device. As seen in FIG. 2, the source/drain junction depth, plotted on the X-axis, shows the depth of titanium silicide being greater then the depth of cobalt silicide within the source/drain junction. Hence, the bottom of the cobalt silicide contacts the source/drain junction at a point 30 of higher dopant concentration than the point 32 of lower dopant concentration.

Since the cobalt silicide is thinner than conventional titanium silicide on the source/drain areas and contacts the source/drain area at a region of higher doping area, the contact resistance (Rc) is lower when cobalt silicide is employed. This contributes to a lower overall transistor turn-on resistance. Improvement in the technology operating speed is provided when the overall transistor turn-on resistance is lowered.

The use of a thinner cobalt silicide, instead of titanium silicide, tends to lead to a higher sheet resistance (Rs) than a thicker film would. Higher sheet resistance degrades the technology operating speed. Making the cobalt silicide thicker would lower the sheet resistance (Rs). However, this presents a problem in that thickening the silicide while using a conventionally doped junction causes the contact resistance (Rc) to increase. As can be seen from FIG. 2, the source/drain dopant implant is traditionally peaked at the surface to maintain the junction at a shallow depth in order to minimize short channel effects. A thicker cobalt silicide film therefore will make contact at a region of lower doping, similar to the titanium silicide, resulting in a higher contact resistance (Rc).

SUMMARY OF THE INVENTION

There is a need for a source/drain silicide that is relatively thick in order to have a desirably low sheet resistance, but at the same time contacts the source/drain junction at the region of highest dopant concentration, thereby providing a low contact resistance.

These and other needs are satisfied by the present invention which provides a method of forming contacts for a semiconductor device. Embodiments of the method include the steps of forming source and drain regions on a substrate having a top surface. The regions are retrograde implanted with dopants such that the concentration of the dopants within the regions is highest at a predetermined depth below the top surface of the substrate. Silicide contacts are then formed on the source/drain regions. The silicide contacts have bottom surfaces that contact the source/drain regions at a predetermined depth.

By targeting the depth of the peak of the dopant concentration to be at the predetermined depth, and ensuring that this coincides with the bottom of the silicide contacts, it is assured that the bottom of the silicide film will contact the source/drain area at the region of the greatest doping concentration. This allows the silicide film to be made thicker, with lower sheet resistance, without sacrificing the lower contact resistance since the silicide desirably contacts the source/drain area at the region of highest doping concentration. Both of these improved factors tend to increase the technology operating speed.

The earlier stated needs are met by another embodiment of the present invention which provides an arrangement comprising a semiconductor device having source/drain regions located within a substrate having a top surface. The source/drain regions contain dopants distributed throughout the depth of the source/drain regions in a retrograde distribution so that the dopant concentration peaks at a predetermined depth from the top surface of the substrate. Silicide contacts are formed on the regions. The silicide contacts have bottom surfaces that contact the source/drain regions at the predetermined depth.

Additional features and advantages of the present invention will become readily apparent to those skilled in the art from the following detailed description, when embodiments of the invention are described, simply by way of the best mode contemplated for carrying out the invention. As will be realized, the invention is capable of other and different embodiments and its several details are capable of modifications in various obvious respects, all without departing from the invention. Accordingly, the drawings and description are to be regarded as illustrative in nature and not as restrictive.

DETAILED DESCRIPTION OF THE INVENTION

The present invention improves the technology operating speed of a semiconductor device by ensuring that the bottom of the silicide film contacts the source/drain area at the region of highest doping. This results in a lower contact resistance while allowing the sheet resistance also to be lower. The lower sheet resistance is achieved in the present invention by allowing the cobalt silicide to be made thicker. The lower contact resistance is not compromised by the increased thickness of the cobalt silicide, however, since the present invention provides a retrograde implant in order to locate the peak of the doping concentration below the surface of the substrate. In other embodiments, in which the peak of the doping concentration is at or near the substrate surface, amorphous silicon is provided on the substrate surface to add to the source/drain junctions. When the silicide is formed, the bottom of the silicide extends to this region because of the added amorphous silicon.

Figure 1:
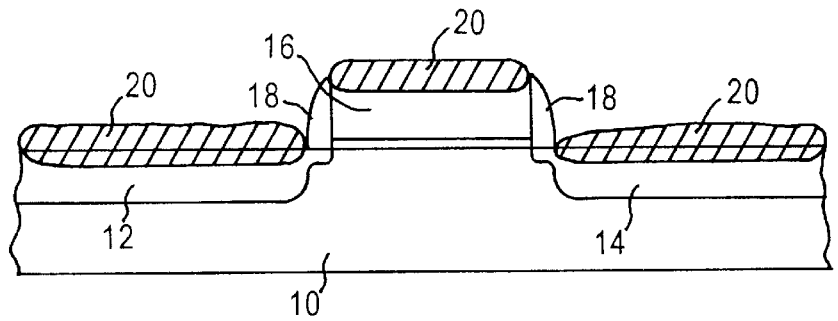
FIG. 1 is a cross-section of a portion of a semiconductor wafer processed in accordance with the prior art.
Figure 2:
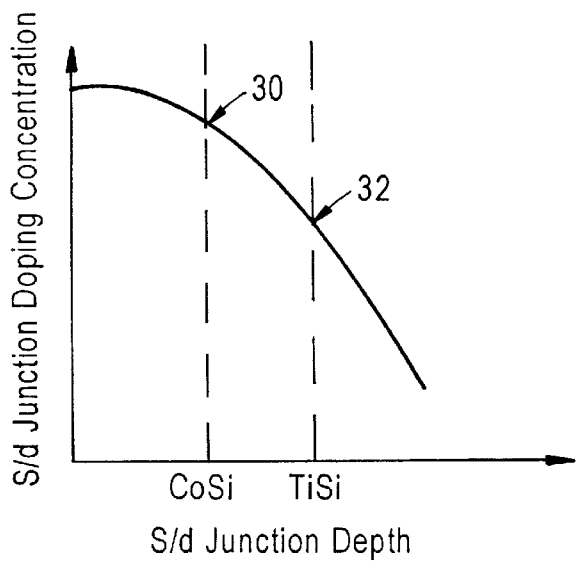
FIG. 2 is a plot of a source/drain junction doping concentration as it varies with the source/drain junction depth in a conventionally doped device.
Figure 3:
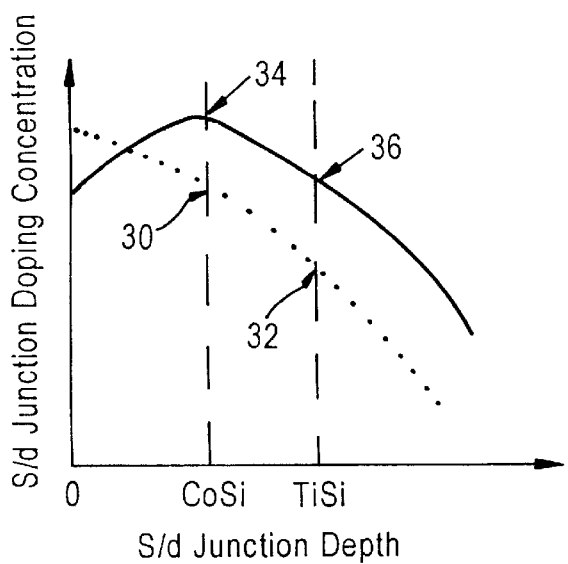
FIG. 3 is a plot of a source/drain junction doping concentration in relation to the source/drain junction depth for a semiconductor device doped in accordance with an embodiment of the present invention.

As described earlier, it is desirable for improved turn-on performance and lower contact resistance to have the bottom of the silicide film contact the source/drain areas at the region of highest doping. FIG. 3 is an exemplary implanting profile of a semiconductor device implanted with dopants in accordance with an embodiment of the present invention. A comparison of the profile of FIG. 3 with the conventional implanting profile of FIG. 2 shows that the peak of the dopant concentration is not at the surface of the substrate or source/drain junction, but rather occurs at a certain predetermined depth below the top surface of the substrate. As is apparent from the Figure, the depth of the bottom of the cobalt silicide may be made to coincide with the peak of the dopant concentration at reference point 34. This would provide the lowest contact resistance (Rc) for the cobalt silicide, while also allowing the cobalt silicide to be relatively thicker.

The present invention also finds utility when applied to other types of silicides, such as titanium silicide, nickel silicide, platinum silicide, etc. This is apparent from FIG. 3, which depicts the depth of the bottom of the titanium silicide crossing the dopant concentration at reference point 36. The concentration at this point 36 is much higher due to the retrograde implanting profile than that at point 32 in a conventional device having the implanting profile of FIG. 2. Hence, even with more typically used titanium silicide, the retrograde implanting of the dopants in accordance with the invention improves the resistance of the silicide film. Although the invention is described hereafter with respect to a cobalt silicide embodiment due to certain advantages of cobalt silicide, the present invention is applicable to other types of suicides. In such other embodiments, however, it is preferred to alter the retrograde profile to account for the thickness of the titanium silicide, or even a thicker cobalt silicide, such that the profile peaks at reference point 36 (i.e., at a greater depth), rather than at reference point 34.

Figure 4:
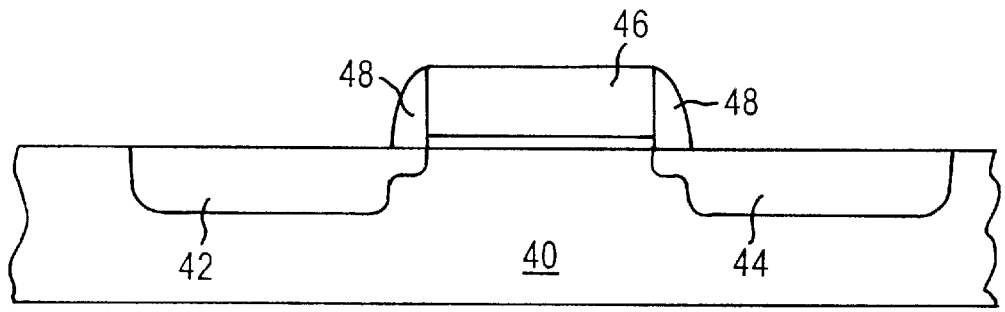
FIG. 4 is a cross-section of the portion of a semiconductor wafer following the formation of source/drain junctions, processed in accordance with embodiments of the present invention.

FIG. 4 is a section of a cross-section of a portion of a semiconductor wafer following the initial formation of the source/drain junction by lightly, and then heavily, doping the substrate 40. The substrate 40 of FIG. 4 has been lightly and then heavily doped with boron or phosphorous, for example, to form a source region 42 and a drain region 44. A gate etch has produced a gate 46. Oxide (or nitride) spacers 48 are provided on the sides of the polysilicon gate electrode 46. Each of the light doping and heavy doping implantation steps may be followed by a heating step to activate the dopants.

Figure 5:
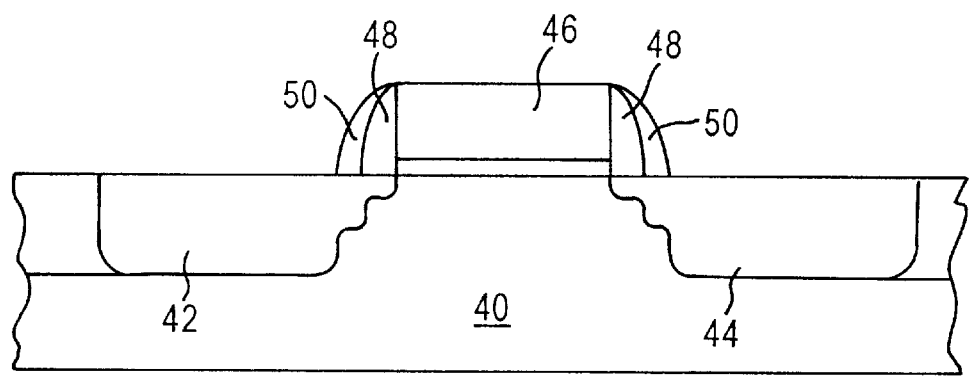
FIG. 5 is a cross-section section of the semiconductor wafer of FIG. 4, following the formation of silicide/ retrograde doping spacers in accordance with an embodiment of the present invention.

FIG. 5 depicts the semiconductor device of FIG. 4 after additional spacers 50 are formed on the first source/drain spacers 48. These additional spacers 50 are silicide/retrograde doping spacers and are also made of oxide or nitride. The silicide/retrograde spacers 50 are employed in embodiments in which transistor short channel effects are a concern. They are used to cause the retrograde doping implants to be located further laterally from the transistor. In other embodiments, however, in which the transistors short channel effects are not an issue, the silicide/retrograde doping spacers 50 are not used. In these embodiments, the retrograde/silicide source/drain implant replaces the normal source/drain implant. Hence, the structure of the semiconductor device is more as it appears in FIG. 4 in such embodiments. However, the description of the invention will continue to describe the embodiments that include the silicide/retrograde doping spacers 50, assuming that transistor short channel effects may be a concern.

Figure 6:
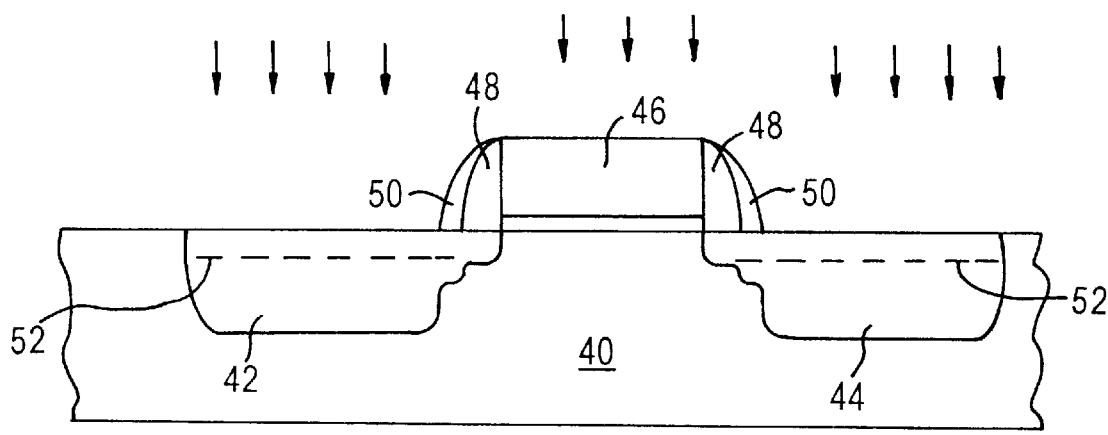
FIG. 6 is a cross-section of a portion of a semiconductor wafer according to FIG. 5, depicting retrograde implanting in the substrate to achieve the doping profile depicted in FIG. 3, in accordance with an embodiment of the present invention.

In FIG. 6 the retrograde doping implantation is performed and a heating step is then employed to activate the dopants. In the embodiment of FIG. 6, therefore, a heavy doping, and then the retrograde doping has followed a light doping. The retrograde doping is performed with an implantation energy level sufficient to produce the profile as depicted, for example, in FIG. 3. The region of highest doping concentration is located below the surface as indicated by reference numeral 52. This depth is measured from the top surface of the substrate 40 and coincides with the depth of the peak dopant concentration 34 depicted in FIG. 3. As those of ordinary skill in the art would appreciate, the predetermined depth of the highest dopant concentration may be set at any appropriate depth by proper selection of implantation energy, taking into consideration the material being implanted and the material into which the dopant is implanted.

The predetermined depth at which the region of greatest doping concentration 52 is located is approximately 20–40%, e.g., 30%, of the depth of the source/drain regions 42, 44 in certain embodiments of the present invention. This percentage changes in other embodiments, to coincide with the thickness of the silicide regions that are to be formed.

Figure 7:
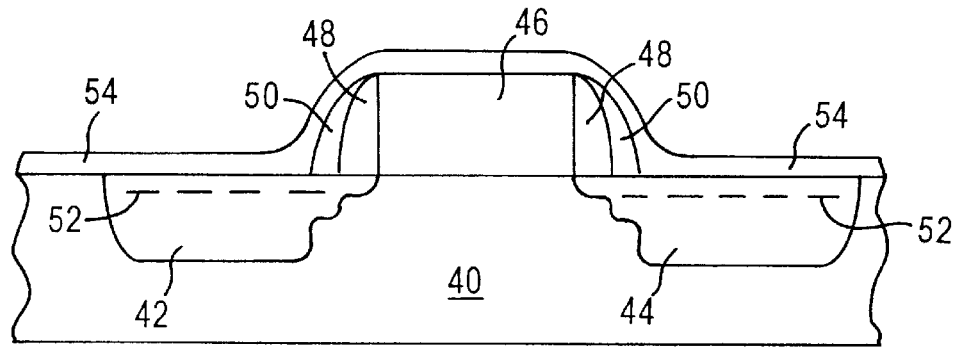
FIG. 7 is a cross-section of the portion of the semiconductor wafer of FIG. 6 after a layer of refractory metal is deposited in accordance with an embodiment of the present invention.
Figure 8:
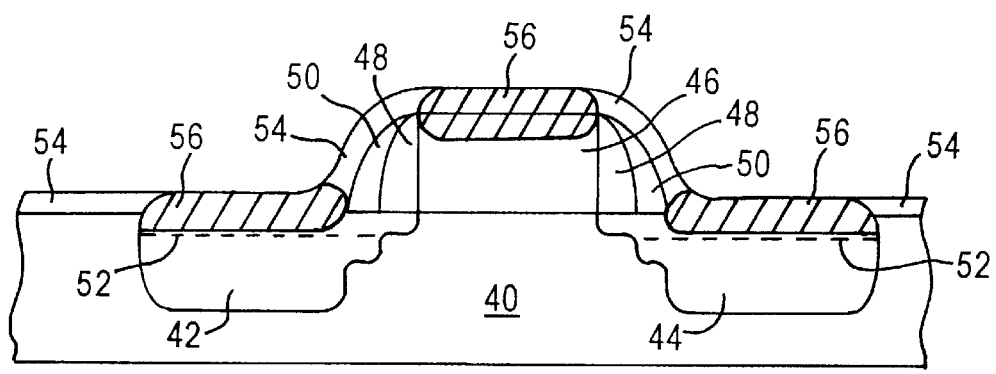
FIG. 8 is a cross-section of the portion of the semiconductor water of FIG. 7 after a first heating step to form silicide regions in accordance with an embodiment of the present invention.

FIG. 7 depicts the semiconductor device of FIG. 6 after a layer of refractory metal, such as cobalt, has been deposited over the device. The refractory metal layer has been provided with reference numeral 54 in FIG. 7. A first rapid thermal step is then performed, as indicated in FIG. 8, to form the first phase of silicide within regions 56. For example, when cobalt comprises the refractory metal in layer 54, the regions 56 are cobalt silicide regions in the monosilicide phase (CoSi) of cobalt silicide. This is a higher resistivity phase of cobalt silicide, as compared to the lower resistivity, disilicide phase ($CoSi_2$). The heating is performed at conventional temperatures and for a conventional time period as known to those of skill in the art.

Figure 9:
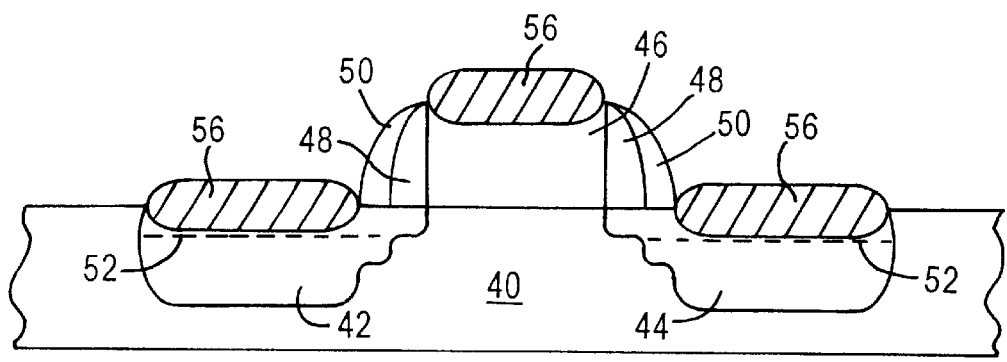
FIG. 9 is a cross-section of the portion of the semiconductor wafer of FIG. 8 after unreacted metal is removed.

FIG. 9 depicts the semiconductor device of FIG. 8, after the unreacted metal in the metal layer 54 is removed. This leaves the silicide regions 56, which will be converted to the low resistivity disilicide phase. This conversion from the high resistivity phase to the low resistivity phase is accomplished by performing a second rapid thermal step in a conventional manner, normally at a temperature greater than that employed in the first rapid thermal anneal step.

As is depicted in FIG. 9, the bottom of the silicide regions 56 contacts the regions 42 and 44 at the predetermined depth 52 at which the greatest concentration of doping is provided in accordance with embodiments of the present invention. The retrograde implant to place the region of greatest doping concentration below the surface of the substrate by a predetermined depth allows the bottom of the silicide region 56 to be located in this highly-doped region to thereby lower the contact resistance. However, the sheet resistance of the silicide regions 56 is not necessarily increased, as the silicide regions 56 may be made thicker since concern over lowering the contact resistance is obviated. For example, in certain preferred embodiments, when the silicide regions 56 are cobalt silicide, the regions have a thickness between 100 Å and about 400 Å, e.g., about 300 Å. These somewhat thicker cobalt silicide regions 56 will therefore have a low sheet resistance, but will also have a low contact resistance since the bottom of the regions 56 contact the region of greatest doping concentration in the regions 42, 44. Both factors will tend to increase technology-operating performance.

It may be difficult with heating cycles to maintain the region of greatest dopant concentration at a predetermined depth below the surface of the substrate 40. In such cases the region of greatest doping concentration 52 may be near or at the top surface of the substrate 40. Certain embodiments of the present invention provide an amorphous silicon layer in order to account for this concern. In such embodiments, a retrograde implanting need not be performed.

Figure 10:
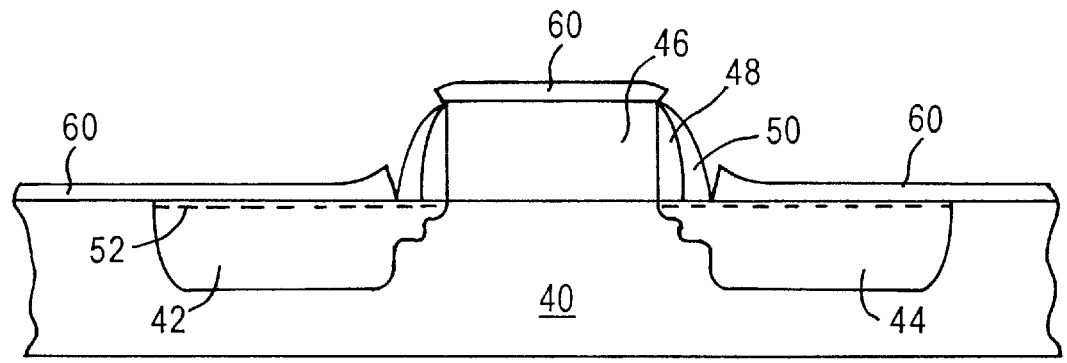
FIG. 10 is a cross-section of the portion of the semiconductor wafer of FIG. 6 following the formation of an amorphous silicon layer over the gate spacers and source/drain junctions in accordance with another embodiment of the present invention.

In FIG. 10, amorphous silicon layer 60 is deposited over the semiconductor device depicted in FIG. 6. The layer 60 may be deposited to a thickness of between about 50 Å and about 200 Å. This has the effect of adding height to the source/drain junctions 42, 44.

Figure 11:
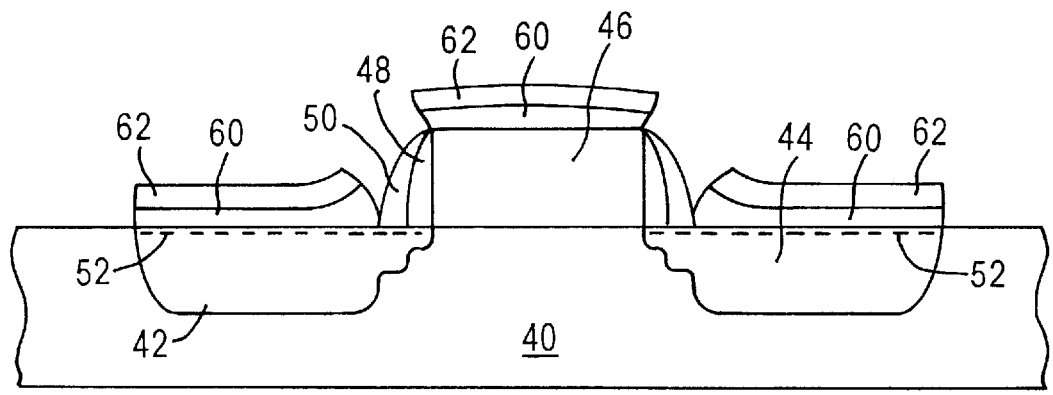
FIG. 11 is a cross-section of the portion of the semiconductor wafer of FIG. 10 following deposition of a refractory metal layer in accordance with an embodiment of the present invention.
Figure 12:
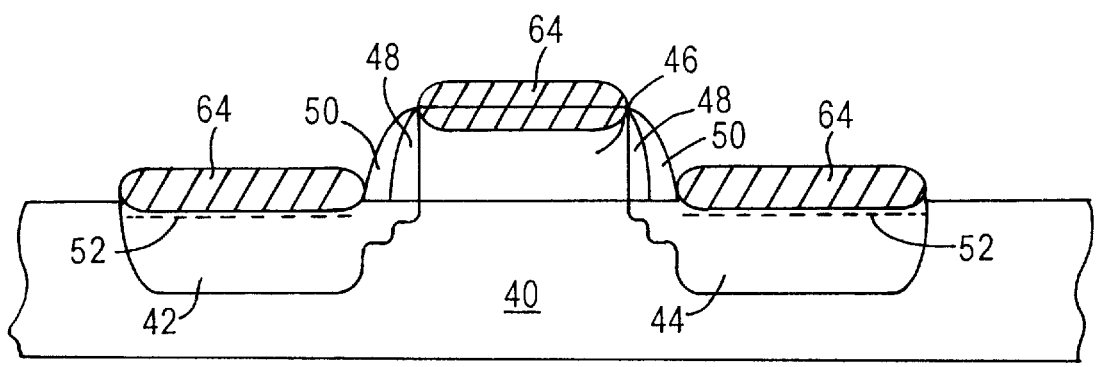
FIG. 12 is a cross-section of the portion of the semiconductor wafer of FIG. 11 following heating to form suicide regions in accordance with an embodiment of the present invention.

In FIG. 11, a refractory layer 62, comprising cobalt or nickel, for example, is deposited over the amorphous silicon layer 60. A first rapid thermal anneal step is then performed to form the monosilicide phase cobalt silicide regions 64, as depicted in FIG. 12. A first rapid thermal anneal step is performed at conventional temperatures for a conventional period of time. A second rapid thermal annealing step, at more highly elevated temperatures than that of the first rapid thermal annealing step, is then performed to convert the higher resistivity monosilicide to a lower resistivity disilicide. Conventional temperatures and exposure time may be used to perform this conversion.

As seen in FIG. 12, the bottom of the silicide regions 64 extend just below the top surface of regions 42, 44. Since in this embodiment the greatest dopant concentration is at or just below the top surface of the source/drain regions 42, 44, the additional amorphous silicon provided in the amorphous silicon layer 60 essentially raises these source/drain junctions 42, 44. Hence, the silicon that is consumed during the salicidation process is mostly contained within the amorphous silicon layer 60 which has been deposited on top of the substrate 40. The silicide regions 64 therefore do not extend to any appreciable extent below the area of greatest dopant concentration 52, even though this area is at or near the top surface of the substrate 40. In this embodiment, therefore, the advantageous low contact resistance provided by cobalt silicide is maintained, while providing a lower sheet resistance with a thicker suicide.

The embodiment of FIG. 12 assumes that cobalt silicide is not formed on the spacers 48, 50, as the silicide regions 64 cannot all contact one another. This can be accomplished in different manners, such as by masking and removing the cobalt over the spacers before the silicide regions 64 are formed. Those of ordinary skill in the art will recognize that other ways of assuring that the regions over the spacers 48, 50 are free of silicide are possible.

Although the present invention has been described and illustrated in detail, it is to be clearly understood that the same is by way of illustration and example only and is not to be taken by way of limitation, the present invention being limited only by the terms of the appended claims.

What is claimed is:

1. A method of forming contacts for a semiconductor device, comprising:

forming source and drain regions within a substrate having a top surface;

heavily doping the source and drain regions;

retrograde implanting the source and drain regions with dopant such that the concentration of the dopant within the source and drain regions is highest at a predetermined depth below the top surface of the substrate, and wherein the retrograde implanting of the source and drain regions comprises deeper heavy doping of the source and drain regions; and forming suicide contacts on the source and drain regions, the silicide contacts having bottom surfaces that contact the source and drain regions at the predetermined depth.

2. The method of claim 1, further comprising, prior to the step of heavily doping the source and drain regions, lightly doping the source and drain regions, and forming spacers on the substrate top surface to define doping areas in the source and drain regions.

3. The method of claim 2, further comprising forming additional spacers on the substrate top surface to define retrograde doping areas in the source and drain regions after the source and drain regions are heavily doped and prior to the retrograde implanting of the source and drain regions.

4. The method of claim 3, wherein the silicide is cobalt silicide.

5. The method of claim 1, wherein the silicide is cobalt suicide.

6. The method of claim 1, wherein the predetermined depth is approximately 20–40% of the depth of the source and drain regions.

* * * * *